(12) United States Patent
Oliaei et al.

(10) Patent No.: US 10,837,999 B2
(45) Date of Patent: Nov. 17, 2020

(54) FAULT DETECTION OF A SYSTEM USING A TEST INPUT COMPRISING A LINEAR COMBINATION OF INPUTS OF THE SYSTEM

(71) Applicant: INVENSENSE, INC., San Jose, CA (US)

(72) Inventors: Omid Oliaei, Sunnyvale, CA (US); Adolfo Giambastiani, San Marco (IT)

(73) Assignee: INVENSENSE, INC., San Jose, CA (US)

( * ) Notice: Subject to any disclaimer, the term of this patent is extended or adjusted under 35 U.S.C. 154(b) by 123 days.

(21) Appl. No.: 16/138,949

(22) Filed: Sep. 21, 2018

(65) Prior Publication Data

US 2020/0096555 A1 Mar. 26, 2020

(51) Int. Cl.
*G01R 31/28* (2006.01)
*G01R 31/3183* (2006.01)
*G01C 19/00* (2013.01)
*G01P 15/00* (2006.01)

(52) U.S. Cl.
CPC ......... *G01R 31/2829* (2013.01); *G01C 19/00* (2013.01); *G01P 15/00* (2013.01); *G01R 31/3183* (2013.01); *G01R 31/28* (2013.01); *G01R 31/282* (2013.01)

(58) Field of Classification Search
CPC ...... G01R 31/00; G01R 31/28; G01R 31/282; G01R 31/2829; G01R 31/317; G01R 31/3181; G01R 31/3183; G01C 19/00; G01C 21/165; G01C 25/00; G01P 15/00

USPC ....... 324/500, 512, 522, 523, 527, 528, 531, 324/537, 555, 600, 649, 691, 713, 715, 324/718; 702/1, 33, 35, 57, 58, 59, 127, 702/182, 183, 185; 340/1.1, 3.1, 3.43, 340/3.44

See application file for complete search history.

(56) References Cited

U.S. PATENT DOCUMENTS

| 6,092,217 | A | 7/2000 | Kanekawa et al. | |
|---|---|---|---|---|
| 6,253,350 | B1 * | 6/2001 | Durham | G01R 31/3004 326/121 |
| 2001/0024125 | A1 * | 9/2001 | Groenewold | G01R 31/327 324/535 |
| 2006/0195746 | A1 * | 8/2006 | Cooke | G01R 31/31855 714/741 |

(Continued)

OTHER PUBLICATIONS

Office Action for U.S. Appl. No. 15/471,539 dated Aug. 27, 2018, 34 pages.

(Continued)

*Primary Examiner* — Hoai-An D. Nguyen
(74) *Attorney, Agent, or Firm* — Amin, Turocy & Watson, LLP (57) ABSTRACT

Facilitating fault detection of a system using a test input including a linear combination of inputs of the system is presented herein. A test signal component generates, via a test procedure, a test input signal including a first linear combination of at least two input signals of the system, and applies the test input signal to the system during a phase of respective phases of the test procedure; and a fault detection component detects a fault of the system based on a test output signal corresponding to the test input signal and a second linear combination of respective output signals of the system corresponding to the at least two input signals.

20 Claims, 10 Drawing Sheets

(56) References Cited

U.S. PATENT DOCUMENTS

| | | | |
|---|---|---|---|
| 2011/0057663 A1* | 3/2011 | Iwamoto | G01R 31/31907 324/537 |
| 2014/0019818 A1 | 1/2014 | Jindal et al. | |
| 2016/0241146 A1 | 8/2016 | Oliaei | |
| 2017/0055093 A1 | 2/2017 | Medina | |
| 2018/0284188 A1* | 10/2018 | Oliaei | G01R 31/3183 |

OTHER PUBLICATIONS

International Search Report dated Jul. 9, 2018 for PCT Application No. PCT/US2018/024563, 19 pages.

Non-Final Office Action received for U.S. Appl. No. 15/471,539 dated Dec. 26, 2019, 34 pages.

Final Office Action received for U.S. Appl. No. 15/471,539 dated Feb. 27, 2019, 39 pages.

Final Office Action received for U.S. Appl. No. 15/471,539 dated Mar. 31, 2020, 31 pages.

* cited by examiner

FAULT DETECTION OF A SYSTEM USING A TEST INPUT COMPRISING A LINEAR COMBINATION OF INPUTS OF THE SYSTEM

TECHNICAL FIELD

The subject disclosure generally relates to embodiments for facilitating fault detection of a system using a test input comprising a linear combination of inputs of the system.

BACKGROUND

Electronic computing devices are susceptible to circuit, component, memory, etc. faults. In turn, conventional fault-based technologies duplicate circuits, components etc. of a device, and determine that a fault exists when outputs of the duplicate circuits are not equal. However, such duplication consumes valuable circuit real estate—resulting in extra circuit size and cost. In this regard, conventional fault-based technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventional fault-based technologies utilize duplicate circuits, components etc. to detect faults in a device—increasing circuit size and using valuable die area. On the other hand, various embodiments disclosed herein can conserve circuit area and more efficiently detect circuit faults in a system by applying a test input to the system comprising a linear combination of inputs of the system, and comparing a sum of a test output of the system corresponding to the test input, and a linear combination of outputs of the system corresponding to the inputs, to a defined amount representing a precision, digital precision, etc. of the system.

For example, a system, e.g., linear system, micro-electro-mechanical system (MEMS) sensor, etc. can comprise a test signal component that generates, via a test procedure, process, etc., a test input signal comprising a first linear combination of at least two input signals of the system, e.g., such signals corresponding to outputs of sensor(s) of the system. In an embodiment, an input signal of the at least two input signals comprises a linear combination of a portion of the at least two input signals.

Further, the test signal component can apply the test input signal to the system during a phase of respective phases of the test procedure, e.g., the respective phases corresponding to logic states of the system. In turn, the system can comprise a fault detection component that can detect a fault of the system based on a test output signal corresponding to the test input signal, and a second linear combination of respective output signals of the system corresponding to the at least two input signals.

In this regard, in an embodiment, the fault detection component detects the fault of the system in response to a determination that a sum of the test output signal and the second linear combination of the respective output signals is greater than a defined amount, e.g. greater than a minimum defined precision, digital precision, bit-precision, etc. of the system.

In one embodiment, the system can further comprise a memory component comprising memory devices, e.g., flip-flops, latches, etc., e.g., corresponding to sequential logic of the system. In this regard, the memory devices generate feedback signals representing logic states of the system corresponding to the respective phases.

In another embodiment the system can comprise a sensor component comprising sensor(s), e.g., an accelerometer, gyroscope, acoustic sensor, microphone, pressure sensor, magnetometer, etc. In this regard, the at least two input signals correspond to outputs of respective axes of the sensor(s), and the respective output signals of the system represent states of the sensor(s) corresponding to the respective phases.

In yet another embodiment, the at least two input signals correspond to different sensors, e.g., comprising an acoustic sensor, a microphone, an accelerometer, a gyroscope, a pressure sensor, a magnetometer, etc.

In an embodiment, a method comprises generating, by a system (e.g., MEMS sensor) comprising a processing component (e.g., test signal component, processor, etc.), a test input based on a linear combination of inputs of the system; and based on sum of a test output of the system corresponding to the test input and another linear combination of respective outputs of the system corresponding to the inputs being determined to be greater than a defined amount with respect to a precision level corresponding to the respective outputs, generating a fault output representing that the system comprises a fault.

In one embodiment, the method further comprises determining, by the system during respective phases of a group of phases, the respective outputs in response to applying, during the respective phases, the inputs to the system.

In another embodiment, the method further comprises determining, by the system during a phase of the group phases, the test output in response to applying, during the phase, the test input to the system.

In yet another embodiment, the applying the test input comprises determining yet another linear combination of at least two inputs of the inputs; and applying such linear combination to the system during the phase of the group of phases.

In an embodiment, the applying the inputs to the system comprises applying, by the system during a first phase of the group of phases, a first input of the inputs corresponding to a first sensor of the system; and applying, by the system during a second phase of the group of phases, a second input of the inputs corresponding to a second sensor of the system.

In one embodiment, the applying the inputs to the system comprises applying, by the system during a first phase of the group of phases, a first input of the inputs corresponding to a first type of sensor (e.g., accelerometer, gyroscope, etc.) of the system; and applying, by the system during a second phase of the group of phases, a second input of the inputs corresponding to a second type of sensor of the system—the first type of sensor being different from the second type of sensor.

In another embodiment, the determining the respective outputs comprises determining the respective outputs based on respective states of memory devices of the system corresponding to the group of phases.

In yet another embodiment, the determining the test output comprises determining the test output based on a state of the respective states of a memory device of the memory devices corresponding to the phase.

In an embodiment, the method further comprises determining, by the system, whether the sum is greater than the defined amount with respect to the precision level corresponding to the respective outputs.

In one embodiment, a sensor system comprises: a group of MEMS sensors that generate respective output signals based on respective external stimuli; a fault detection component that generates a test input signal based on a first linear combination of the respective output signals that have been generated by the group of MEMS sensors, applies, during respective phases, the test input signal and the respective output signals that have been generated by the group of MEMS sensors to a linear component (e.g., logic, sequential logic, etc.) of the sensor system, determines a sum of a test output of the linear component corresponding to the test input signal and a second linear combination of outputs of the linear component responding to the respective output signals that have been generated by the group of MEMS sensors, and generates a fault signal in response to a determination that the sum satisfies a defined condition with respect to being greater than a defined precision level of the linear component.

In another embodiment, outputs of the linear component are generated based on respective states of memory devices of the linear component.

In yet another embodiment, the group of MEMS sensors comprises an acoustic sensor, a microphone, an accelerometer, a gyroscope, a pressure sensor, and/or a magnetometer.

As described above, conventional fault-based technologies have had some drawbacks with respect to utilizing duplicate circuits to detect device faults. On the other hand, various embodiments disclosed herein can conserve die area and efficiently detect circuit faults by applying, to a system, a test input comprising a linear combination of inputs of the system; and comparing a sum of a test output of the system corresponding to the test input, and a linear combination of outputs of the system corresponding to the inputs, to a defined amount, e.g., minimum precision of the system.

Figure 1:
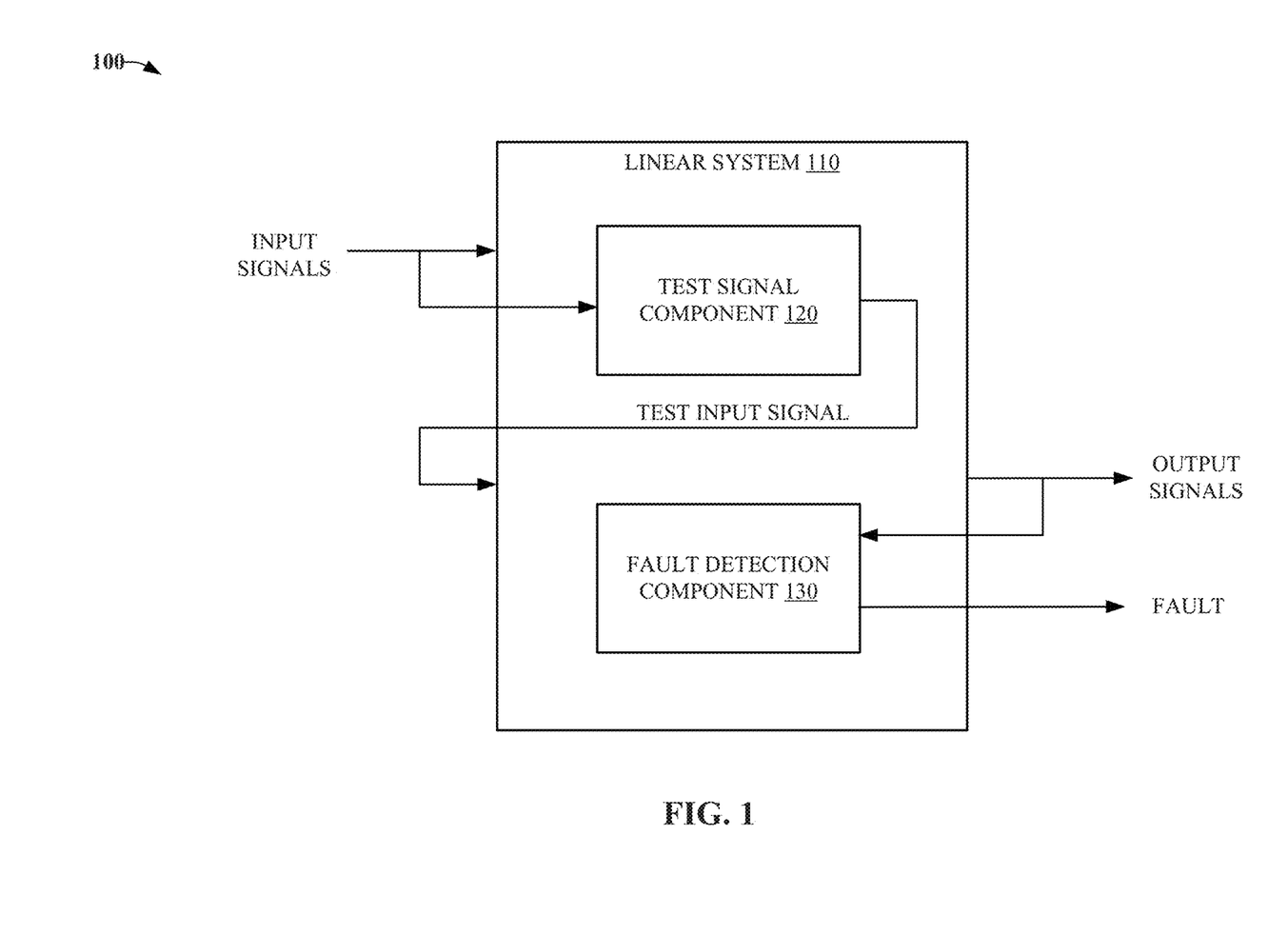
FIG. 1 illustrates a block diagram of a linear system that facilitates fault detection using a test input signal comprising a linear combination of inputs of the linear system, in accordance with various example embodiments.
Figure 2:
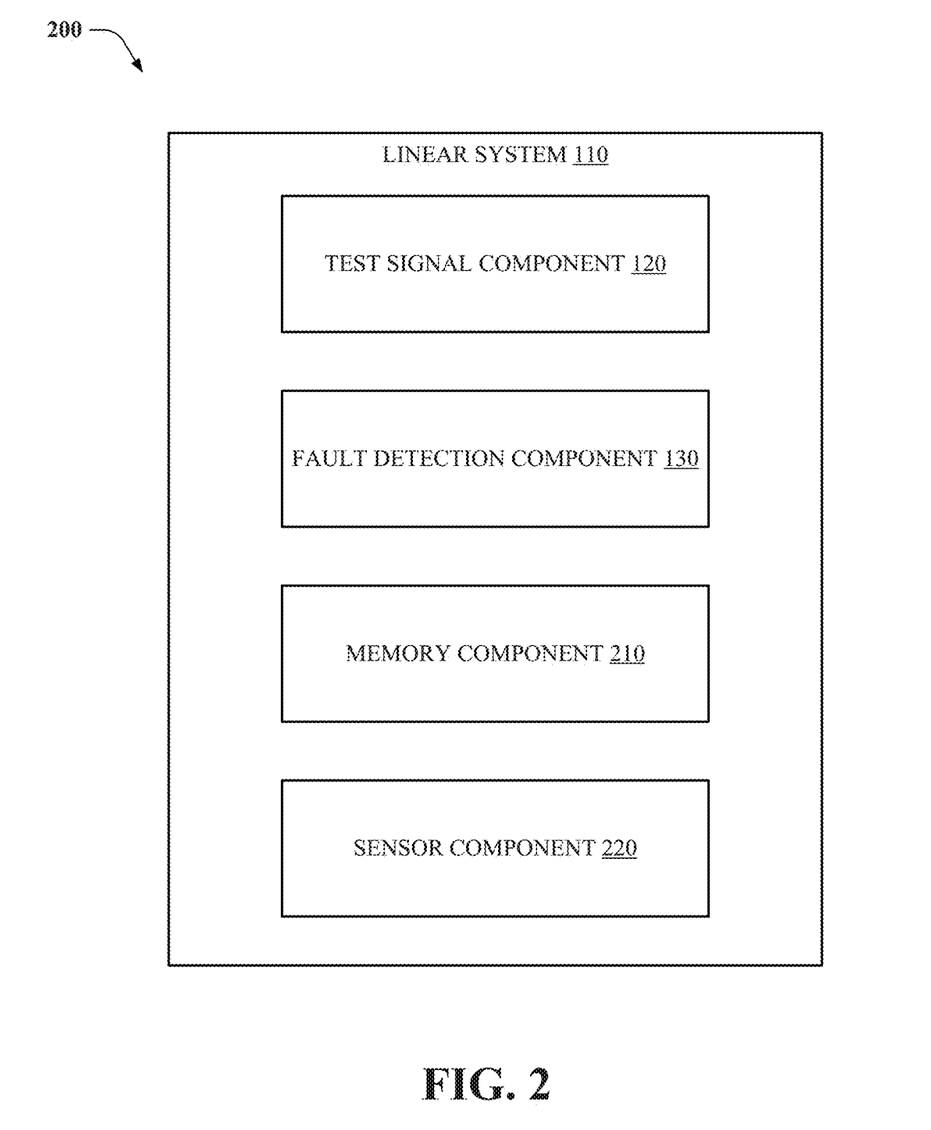
FIG. 2 illustrates a block diagram of a linear system, comprising a memory component and a sensor component, which facilitates fault detection using a test input signal comprising a linear combination of inputs of the linear system, in accordance with various example embodiments.
Figure 3:
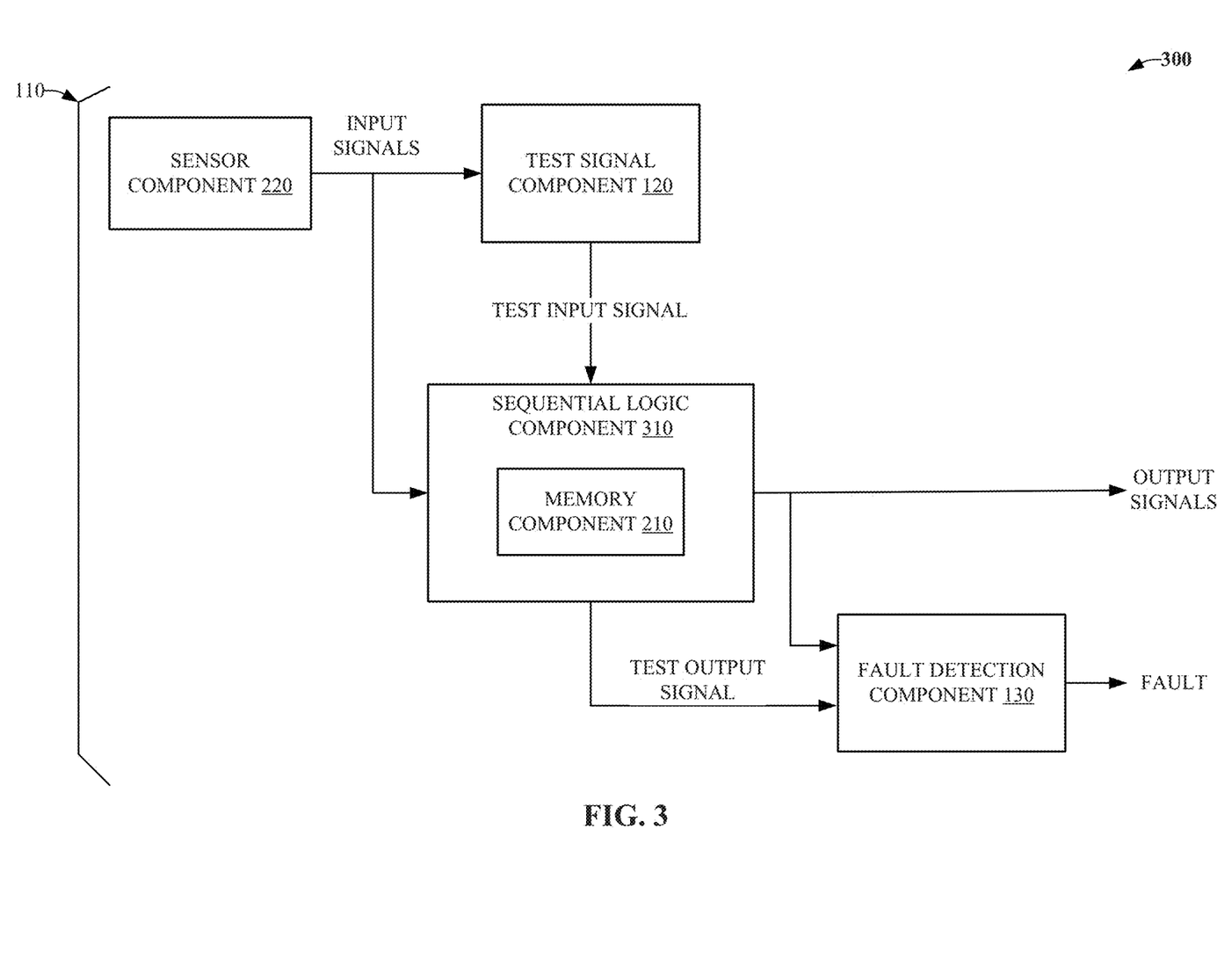
FIG. 3 illustrates a block diagram of a linear system, comprising a sequential logic component, which facilitates fault detection using a test input signal comprising a linear combination of inputs of the linear system, in accordance with various example embodiments.

In this regard, and now referring to FIG. 1, a block diagram (100) of a linear system (110) that facilitates fault detection using a test input signal comprising a linear combination of input signals of the linear system is illustrated, in accordance with various example embodiments. The linear system comprises a test signal component (120) and a fault detection component (130). The test signal component can generate, e.g., via a test procedure, process, etc., a test input signal comprising a linear combination of input signals of the linear system. In embodiment(s), the input signals can comprise output signals of sensors, MEMS sensors, etc. (not shown) (e.g., an acoustic sensor, a microphone, an accelerometer, a gyroscope, a pressure sensor, a magnetometer, etc.). In other embodiment(s), the input signals can comprise an output signal generated by a component (e.g., a memory component (e.g., see 210 described below), a sensor component comprising the sensors, MEMS sensors, etc. (e.g., see 220 described below), the test signal component, the fault detection component, a sequential logic component (e.g., see 310 described below), etc.

In yet other embodiment(s), the input signals can comprise output signals corresponding to different axes of a sensor, different sensors, etc. (not shown) of the linear system. In an embodiment, an input signal of the two or more input signals can comprise a linear combination of one or more of the input signals.

Further, the test signal component can apply the test input signal to the system during a phase of respective phases of the test procedure, e.g., the respective phases corresponding to logic states of the system. For example, in embodiment(s), the test signal component can sequentially apply the test input signal to the system in a time multiplexed manner, e.g., corresponding to the respective phases.

In turn, the fault detection component can detect a fault of the system based on a determination that a test output signal corresponding to the test input signal, and a linear combination of respective output signals of the system corresponding to the input signals satisfies a defined condition, e.g., with respect to a sum of such signals being greater than a defined amount, e.g., a defined minimum precision, digital precision, etc. of the system, e.g., corresponding to the respective output signals.

Figure 4:
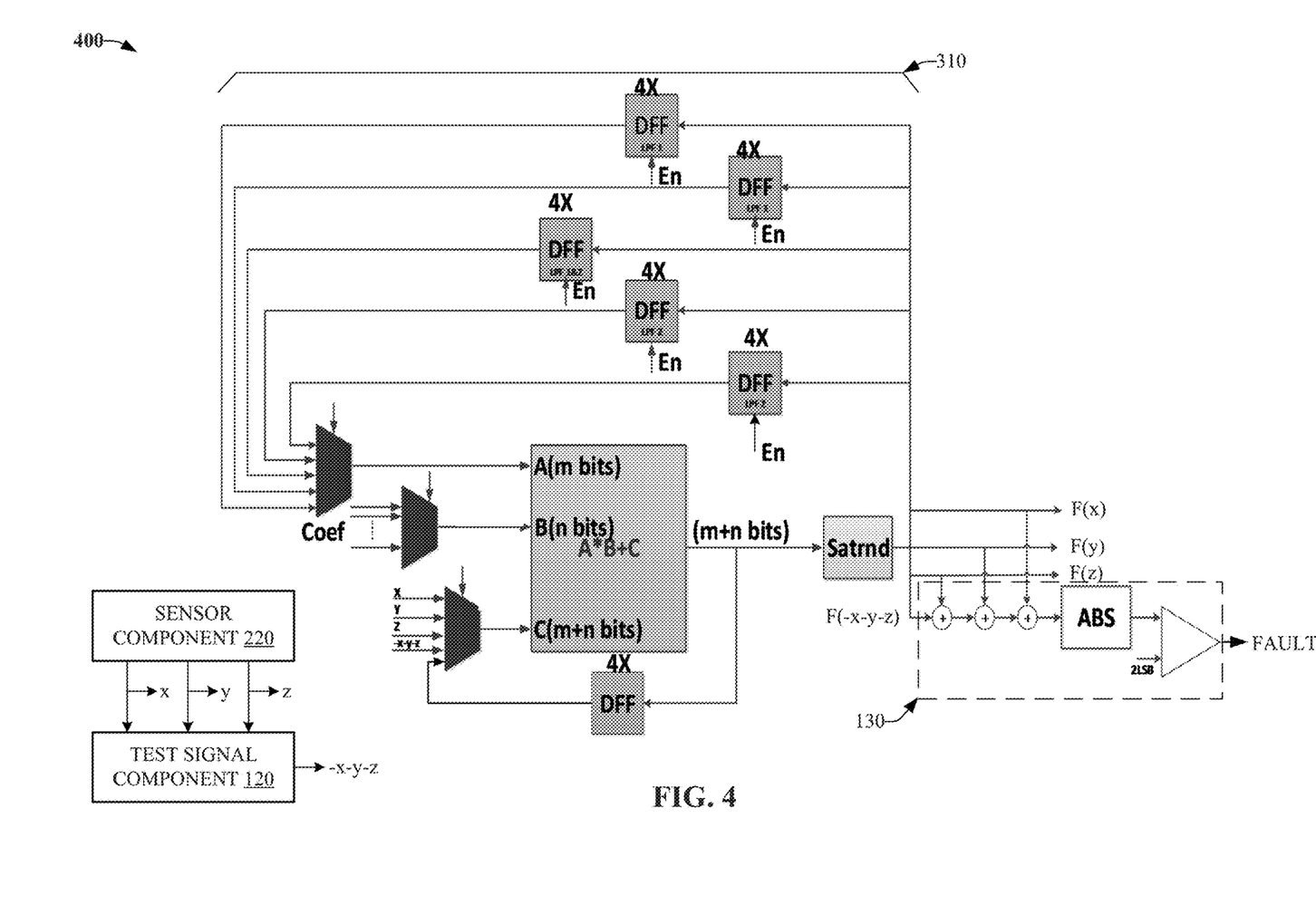
FIG. 4 illustrates another block diagram of a linear system, comprising a sequential logic component, which facilitates fault detection using a test input signal comprising a linear combination of inputs of the linear system, in accordance with various example embodiments.

Rereferring now to FIGS. 2-4, in various example embodiment(s), the linear system can further comprise a memory component (210) and a sensor component (220). The sensor component can comprise sensor(s) (not shown), e.g., an accelerometer, a gyroscope, an acoustic sensor, a microphone, a pressure sensor, a magnetometer, etc. In this regard, the input signals can comprise outputs of respective axes of the sensor(s), and the respective output signals can represent states of the sensor(s) corresponding to the respective phases.

For example, in one embodiment, the sensor component can comprise accelerometer(s) (not shown), and the input signals can correspond to outputs of respective axes (e.g., x, y, and z) of the accelerometer(s). In another embodiment, the sensor component can comprise gyroscope(s) (not shown), and the input signals can correspond to outputs of respective axes (e.g., x, y, and z) of the gyroscope(s). In yet another embodiment, the sensor component can comprise a pressure sensor(s), a magnetometer, etc. (not shown), and the input signals can correspond to respective axes (e.g., x, y, and z) of the pressure, sensor, the magnetometer, etc.

In other embodiment(s), the input signals can correspond to outputs of different sensors, e.g., comprising an acoustic sensor, a microphone, an accelerometer, a gyroscope, a pressure sensor, a magnetometer, etc. In yet other embodiment(s), an input signal of the input signals can comprise a linear combination of a portion of the input signals.

The memory component can comprise memory devices, e.g., flip-flops (FFs), latches, volatile memory, non-volatile memory, etc. corresponding to sequential logic of the linear system (see, e.g., DFFs of sequential logic component 310 illustrated by FIG. 4). In this regard, the memory devices can generate feedback signals representing logic states of the system corresponding to the respective phases, e.g., corresponding to an infinite impulse response (IIR) system in which a logic state of the system is captured in time during a phase of the respective phases via the memory devices.

For example, in an embodiment illustrated by FIG. 4, the sequential logic component can comprise multiplexers that can be configured to select, during a phase, respective inputs, e.g., corresponding to a selected output (e.g., x, y, z) associated with respective axes of sensor(s) (not shown) of the sensor component.

Further, the multiplexers can pass the respective inputs to a multiplier-accumulator (MAC) component, device, etc. of the sequential logic component. In turn, a MAC operation can be performed on the respective inputs to generate a MAC result, and the MAC result can be passed to a saturate and round (satrnd) component, device, etc. of the sequential logic component to obtain respective output signals (e.g., F(x), F(y), F(z)) corresponding to the respective inputs (e.g., x, y, z) based on the respective phases.

In turn, a multiplexer of the multiplexers can receive the test input signal generated by the test signal component, and pass the test input signal to the MAC component, device, etc. Further, a MAC operation can be performed on the test input signal to obtain an intermediate test output signal, which can be passed to the satrnd component, device, etc. to obtain a test output signal corresponding to the test input signal.

In various embodiment(s), the test input signal can have the following form comprising a linear combination of inputs x, y, and z, e.g., corresponding to three axes of a particular sensor, corresponding to respective axes of different sensors, etc.:

$$\text{test input} = \alpha x + \beta y + \gamma z, \quad (1)$$

where $\alpha$, $\beta$, and $\gamma$ are rational numbers.

In this regard, in an embodiment illustrated by FIG. 4, the test signal component can generate a test input signal that equals $-x-y-z$ (in which $\alpha$, $\beta$, and $\gamma = -1$). Further, based on a selection of the test input signal via the multiplexers during one of the phases of the phases, the fault detection component can receive the test output signal $F(-x-y-z)$ corresponding to the test input signal.

In embodiment(s), it should be appreciated that the following relationship holds for a linear system:

$$F(-x-y-z) = -F(x)-F(y)-F(z). \quad (2)$$

In turn, based on the relationship represented by equation (2), the fault detection component can determine whether the following identity is satisfied:

$$F(x)+F(y)+F(z)+F(-x-y-z) == 0. \quad (3)$$

In this regard, as illustrated by FIG. 4, the fault detection component can receive the test output signal (e.g., F(-x-y-z)) and the respective output signals (e.g., F(x), F(y), F(z)), and generate a sum of the test output signal and a linear combination (e.g., $-(-F(x)-F(y)-F(z))$ of the respective output signals using respective adders ("+"). Further, the fault detection component can perform an absolute value operation ("ABS") on the sum, and detect a fault in the sequential logic component based on the identity represented by equation (3), e.g., by determining, using a comparator, that the sum satisfies a defined condition with respect to being greater than a defined amount, e.g., a minimum defined precision, digital precision, etc. (e.g. 2 least significant bits (LSBs)) of the linear system).

In another embodiment (not shown), the test signal component can generate a test input signal that equals $-2x+3y-4z$. Further, based on a selection of the test input signal via the multiplexers during one of the phases of the phases, the fault detection component can receive a test output signal that equals $F(-2x+3y-4z)$.

In embodiment(s), it should be appreciated that the following relationship holds for the linear system:

$$F(-2x+3y-4z) = -2F(x)+3F(y)-4F(z). \quad (4)$$

In turn, based on the relationship represented by equation (4), the fault detection component can determine whether a sum of the test output signal and a linear combination $(-(-2F(x)+3F(y)-4F(z))$ of the respective output signals, represented by the following identity, is satisfied:

$$F(-2x+3y-4z)+2F(x)-3F(y)+4F(z) == 0. \quad (5)$$

FIGS. 5-10 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events.

Figure 5:
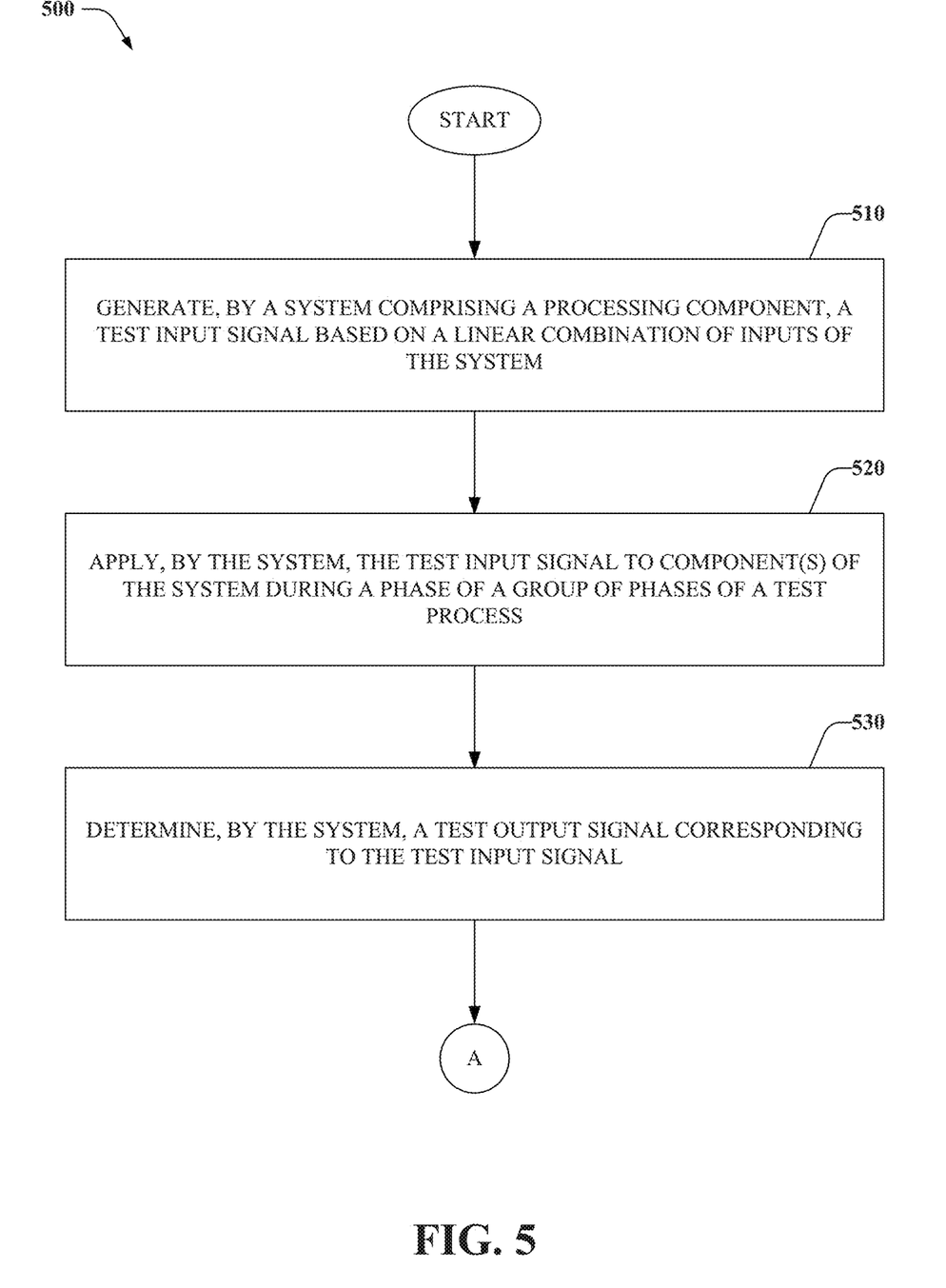
FIGS. 5-7 illustrate flowcharts of a method associated with a linear system that facilitates fault detection using a test input signal comprising a linear combination of inputs of the linear system, in accordance with various example embodiments.
Figure 6:
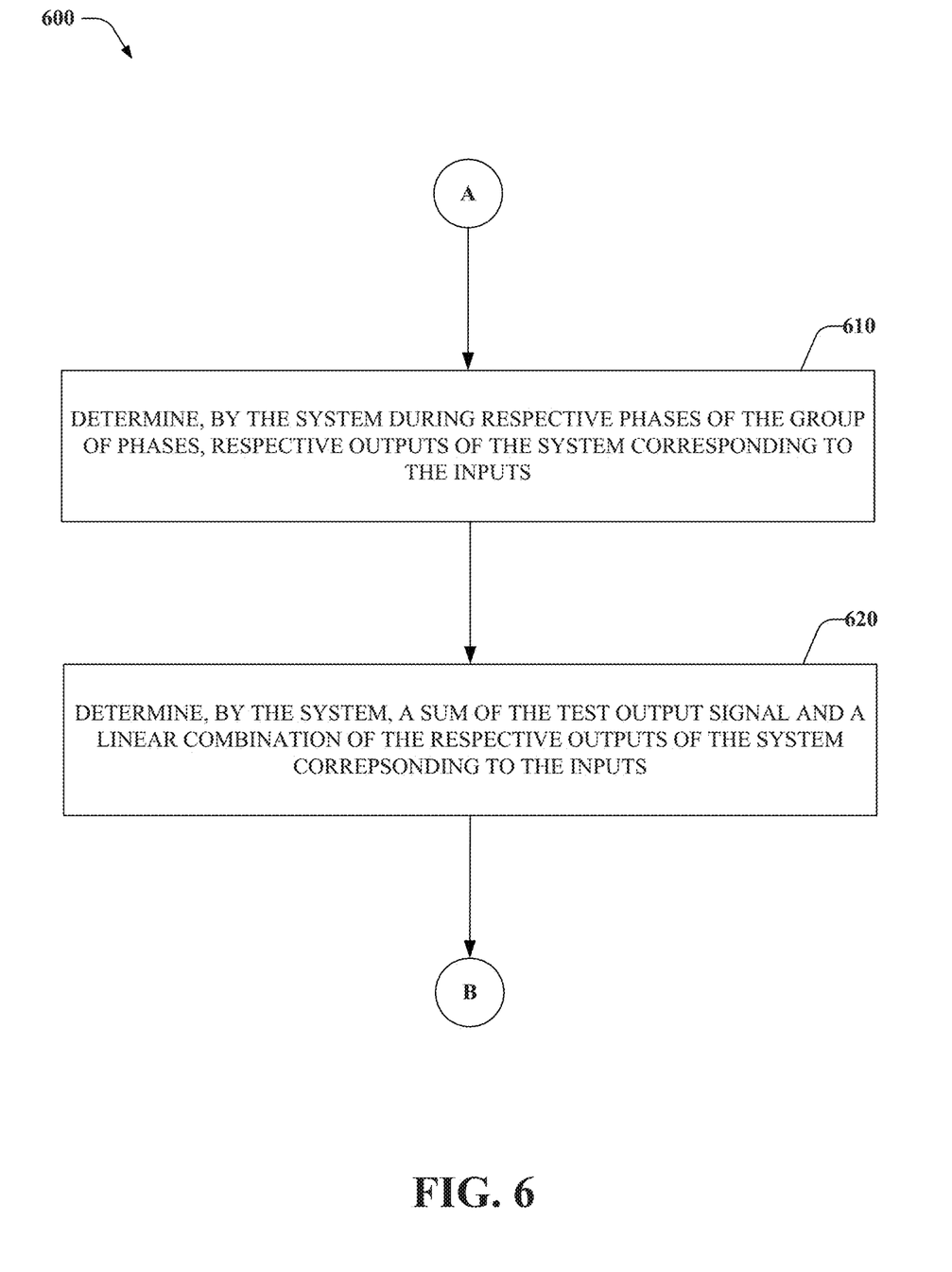
Figure 7:
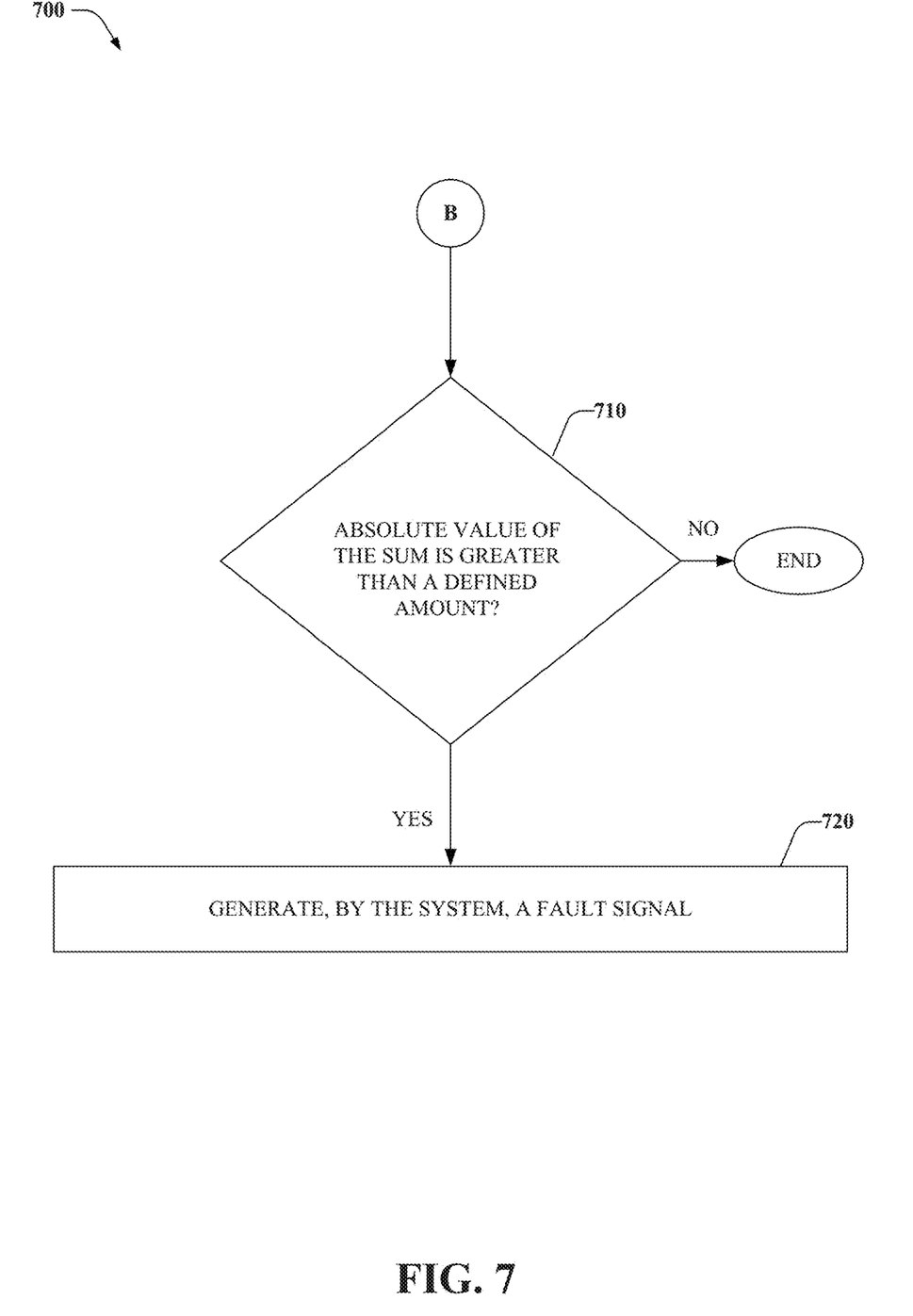

Referring now to FIGS. 5-7, flowcharts of a method associated with a linear system (e.g., 110) that facilitates fault detection using a test input signal comprising a linear combination of inputs of the linear system are illustrated, in accordance with various example embodiments. At 510, a system comprising a processing component (e.g., 120, 130, a MAC, processor, etc.) can generate a test input signal based on a linear combination of inputs of the system. At 520, the system can apply the test input signal to component(s) of the system during a phase of a group of phases of a test process. At 530, the system can determine, e.g., during the phase, another phase, etc., a test output signal corresponding to the test input signal.

At 610, the system can determine, during respective phases of the group of phases, respective outputs of the system corresponding to the inputs. At 620, the system can determine a sum of the test output signal and a linear combination of the respective outputs of the system corresponding to the inputs. At 710, the system can determine whether an absolute value of the sum is greater than a defined amount, e g, minimum digital bit resolution of the system. In this regard, in response to a determination that the absolute value of the sum is greater than the defined amount, flow continues to 720, at which the system generates a fault signal; otherwise flow ends.

Figure 8:
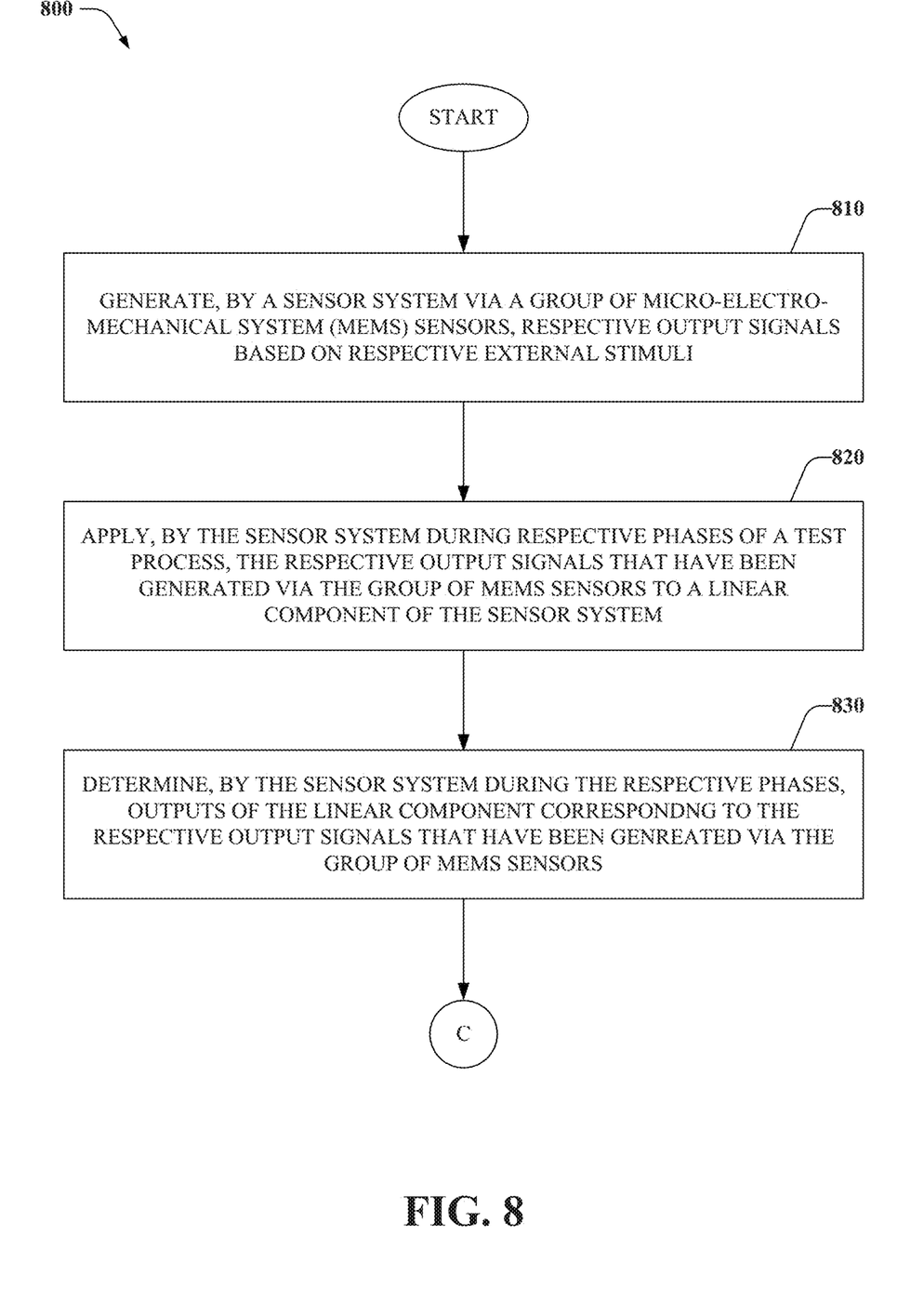
FIGS. 8-10 illustrate flow charts of a method associated with a sensor system, comprising a group of micro-electro-mechanical system (MEMS) sensors, which facilitates fault detection using a test input signal comprising a linear combination of output signals that have been generated by the group of MEMS sensors, in accordance with various example embodiments.
Figure 9:
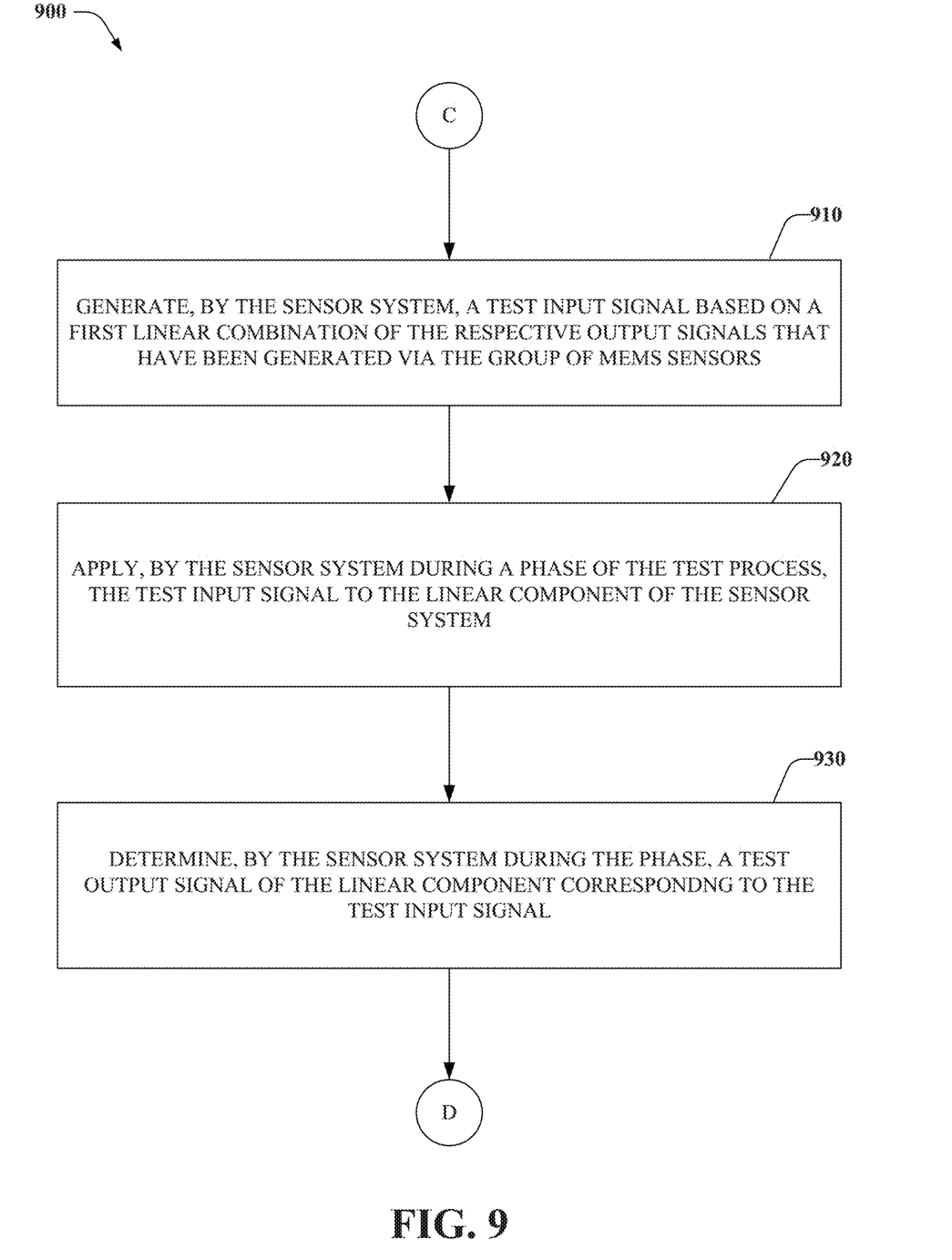
Figure 10:
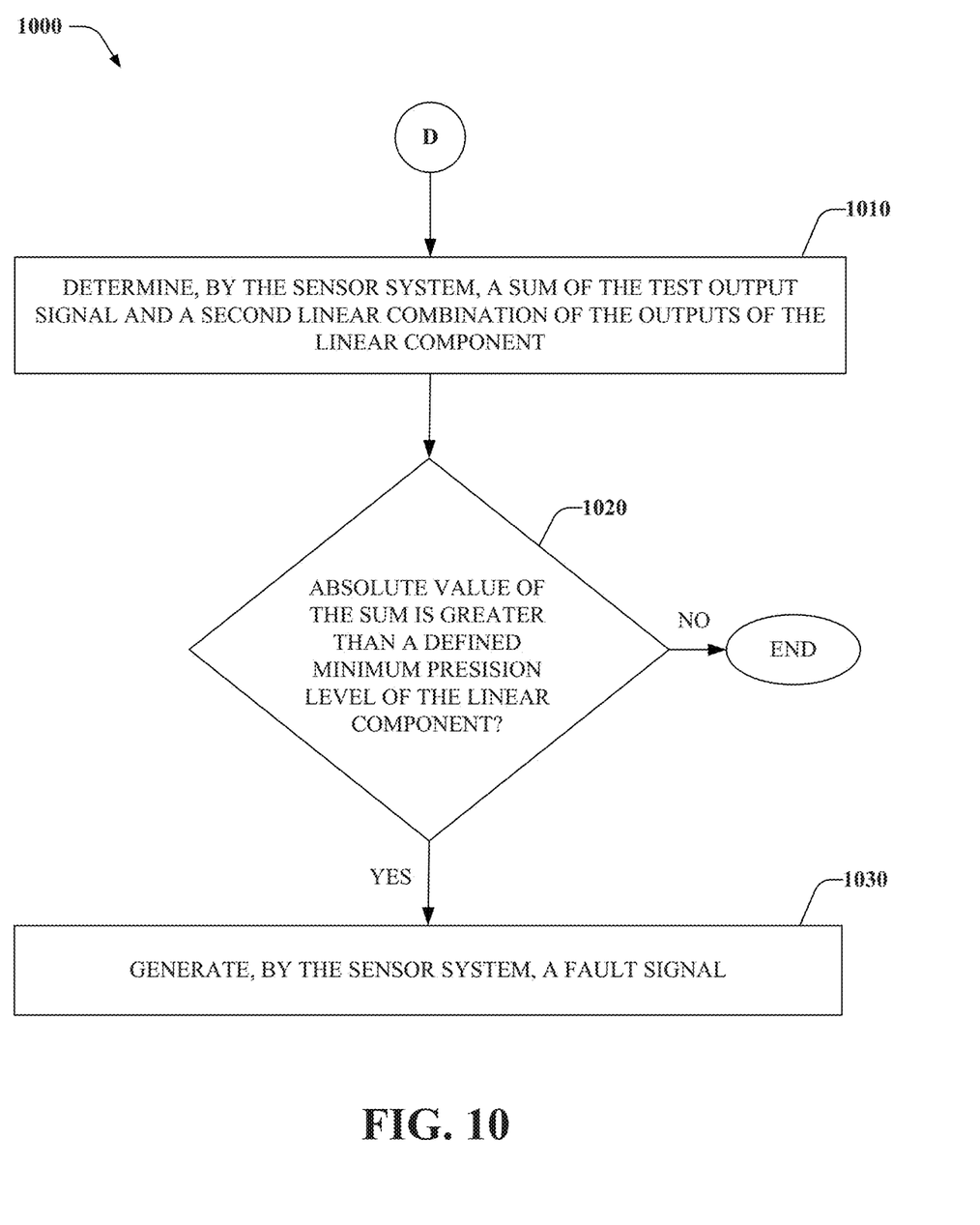

FIGS. 8-10 illustrate flow charts of a method associated with a sensor system, comprising a group of MEMS sensors (e.g., comprising one or more sensors), which facilitates fault detection using a test input signal comprising a linear combination of output signals that have been generated by the group of MEMS sensors, in accordance with various example embodiments. At 810, the sensor system can generate, via the group of MEMS sensors, respective output signals based on respective external stimuli (e.g., force, acceleration, etc.). At 820, the sensor system can apply, during respective phases of a test process, procedure, etc., the respective output signals to a linear component of the sensor system.

At 830, the sensor system can determine, during the respective phases, outputs of the linear component corresponding to the respective output signals that have been generated via the group of MEMS sensors. Flow continues from 830 to 910, at which the sensor system can generate at test input signal based on a first linear combination of the respective output signals that have been generated via the group of MEMS sensors. At 920, the sensor system can apply, during a phase of the test process, procedure, etc., the test input signal to the linear component of the sensor system.

At 930, the sensor system can determine, during the phase, a test output signal of the linear component corresponding to the test input signal. Flow continues from 930 to 1010, at which the sensor system can determine a sum of the test output signal and a second linear combination of the outputs of the linear component. At 1020, the sensor system can determine whether an absolute value of the sum is greater than a defined minimum precision level of the linear component (e.g., with respect to an amount of LSBs of a digital portion of the linear component). In this regard, in response to a determination that the absolute value of the sum is greater than the defined minimum precision level of the linear component, flow continues to 1030, at which the sensor system can generate a fault signal; otherwise flow ends.

As it employed in the subject specification, the term "component" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the term "processing component" can refer to substantially any computing processing unit or device (e.g., MAC, etc.), comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory", "memory component", and substantially any other information storage component relevant to operation and functionality of linear system 110 and/or devices disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A system, comprising:
a test signal component that
generates, via a test procedure, a test input signal comprising a first linear combination of at least two input signals of the system, and
applies the test input signal to the system during a phase of respective phases of the test procedure; and
a fault detection component that
detects, via a comparator of the system, a fault of the system based on a test output signal and a second linear combination of respective output signals of the system, wherein the test output signal is based on the first linear combination of the at least two input signals, wherein the second linear combination of respective output signals is determined, via respective adders, from a first output signal of the respective output signals of the system and a second output signal of the respective output signals of the system, wherein the first output signal is based on a first input signal of the at least two input signals, and wherein the second output signal is based on a second input signal of the at least two input signals.

2. The system of claim 1, wherein the fault detection component detects the fault of the system in response to a determination that a sum of the test output signal and the second linear combination of the respective output signals is greater than a defined amount.

3. The system of claim 2, wherein the defined amount represents a minimum defined precision of the system corresponding to the respective output signals.

4. The system of claim 1, further comprising:
a memory component comprising memory devices that generate feedback signals representing logic states of the system corresponding to the respective phases of the test procedure.

5. The system of claim 1, wherein the system comprises a sensor component comprising an accelerometer, and wherein the at least two input signals correspond to respective axes of the accelerometer.

6. The system of claim 1, wherein the system comprises a sensor component comprising a gyroscope, and wherein the at least two input signals correspond to respective axes of the gyroscope.

7. The system of claim 1, wherein the at least two input signals correspond to different sensors, and wherein the different sensors comprise at least one of an acoustic sensor, a microphone, an accelerometer, a gyroscope, a pressure sensor, or a magnetometer.

8. The system of claim 1, wherein an input signal of the at least two input signals comprises a third linear combination of respective input signals of the at least two input signals.

9. A method, comprising:
generating, by a system comprising a processing component, a test input based on a first linear combination of inputs of the system; and
based on a sum of a test output of the system corresponding to the test input and a second linear combination of respective outputs of the system corresponding to the inputs being determined to be greater than a defined amount with respect to a precision level corresponding to the respective outputs, generating, via a comparator of the system, a fault output representing that the system comprises a fault, wherein the second linear combination of respective outputs of the system is determined, via respective adders, from a first output signal of the respective outputs of the system and a second output signal of the respective outputs of the system, wherein the first output signal is based on a first input signal of the inputs of the system, and wherein the second output signal is based on a second input signal of the inputs of the system.

10. The method of claim 9, further comprising:
in response to applying, during respective phases of a group of phases, the inputs to the system, determining, by the system during the respective phases, the respective outputs.

11. The method of claim 10, further comprising:
in response to applying, during a phase of the group of phases, the test input to the system, determining, by the system during the phase, the test output.

12. The method of claim 11, wherein the applying the test input comprises:
determining a third linear combination of at least two inputs of the inputs; and
applying the third linear combination to the system during the phase of the group of phases.

13. The method of claim 11, wherein the applying the inputs to the system comprises:
applying, by the system during a first phase of the group of phases, a first input of the inputs corresponding to a first sensor of the system; and
applying, by the system during a second phase of the group of phases, a second input of the inputs corresponding to a second sensor of the system.

14. The method of claim 11, wherein the applying the inputs to the system comprises:
applying, by the system during a first phase of the group of phases, a first input of the inputs corresponding to a first type of sensor of the system; and
applying, by the system during a second phase of the group of phases, a second input of the inputs corresponding to a second type of sensor of the system, wherein the first type of sensor is different from the second type of sensor.

15. The method of claim 11, wherein the determining the respective outputs comprises:
   determining the respective outputs based on respective states of memory devices of the system corresponding to the group of phases.

16. The method of claim 15, wherein the determining the test output comprises:
   determining the test output based on a state of the respective states of a memory device of the memory devices corresponding to the phase.

17. The method of claim 9, further comprising:
   determining, by the system, whether the sum is greater than the defined amount with respect to the precision level corresponding to the respective outputs.

18. A sensor system, comprising:
   a group of micro-electro-mechanical system (MEMS) sensors that generate respective output signals based on respective external stimuli; and
   a fault detection component that
      generates a test input signal based on a first linear combination of the respective output signals that have been generated by the group of MEMS sensors,
      applies, during respective phases, the test input signal and the respective output signals that have been generated by the group of MEMS sensors to a linear component of the sensor system,
      determines a sum of a test output signal of the linear component corresponding to the test input signal and a second linear combination of outputs of the linear component corresponding to the respective output signals that have been generated by the group of MEMS sensors, and
      in response to a determination, via a comparator of the sensor system, that an absolute value of the sum satisfies a defined condition with respect to being greater than a defined minimum precision level of the linear component, generates a fault signal,
      wherein the second linear combination of outputs is determined, via respective adders, from a first output of the outputs and a second output of the outputs, wherein the first output is based on a first output signal of the respective output signals that have been generated by the group of MEMS sensors, and wherein the second output is based on a second output signal of the respective output signals that have been generated by the group of MEMS sensors.

19. The sensor system of claim 18, wherein the outputs of the linear component are generated based on respective states of memory devices of the linear component.

20. The sensor system of claim 18, wherein the group of MEMS sensors comprises at least one of an acoustic sensor, a microphone, an accelerometer, a gyroscope, a pressure sensor, or a magnetometer.

* * * * *